United States Patent [19]
Bradley

[11] Patent Number: 6,087,865
[45] Date of Patent: Jul. 11, 2000

[54] PROGRAMMABLE FREQUENCY DIVIDER

[75] Inventor: Donald A. Bradley, Morgan Hill, Calif.

[73] Assignee: Anritsu Company, Morgan Hill, Calif.

[21] Appl. No.: 08/847,672

[22] Filed: Apr. 24, 1997

Related U.S. Application Data

[63] Continuation-in-part of application No. 08/362,179, Dec. 22, 1994, Pat. No. 5,642,039.

[51] Int. Cl.[7] ................................. H03B 19/00
[52] U.S. Cl. .................... 327/117; 327/107; 327/105; 327/154; 377/47; 377/48; 331/2
[58] Field of Search .................... 327/117, 107, 327/105, 154; 324/76.23; 377/47, 48; 331/2

[56] References Cited

U.S. PATENT DOCUMENTS

| | | | |
|---|---|---|---|
| 4,551,689 | 11/1985 | Scala et al. | 331/2 |
| 4,742,566 | 5/1988 | Nordholt et al. | 455/260 |
| 4,763,083 | 8/1988 | Edwards | 331/2 |
| 5,146,186 | 9/1992 | Vella | 331/16 |
| 5,184,093 | 2/1993 | Itoh et al. | 331/25 |
| 5,317,284 | 5/1994 | Yang | 331/2 |
| 5,373,256 | 12/1994 | Nicotra | 331/2 |
| 5,680,067 | 10/1997 | Marchand | 327/117 |
| 5,825,813 | 10/1998 | Na | 375/219 |

OTHER PUBLICATIONS

Roland E. Best, Phase–Locked Loops, Theory, Design, and Applications, McGraw–Hill Book Company, pp.216–230, Jun. 1984.

*Primary Examiner*—Timothy P. Callahan
*Assistant Examiner*—Cassandra Cox
*Attorney, Agent, or Firm*—Fliesler, Dubb, Meyer & Lovejoy

[57] ABSTRACT

A frequency divider includes a mixer having a first input connectable to a reference oscillator and a second input connectable from the reference oscillator through a frequency synthesizer to the second input of the mixer. The mixer provides an output signal to a filter, which provides a frequency divider output. The frequency synthesizer provides an output signal having a frequency of $(N+1)/N$ or $(N-1)/N$ times the input $F_{IN}$ from the reference oscillator. With the frequency synthesizer providing the signal $F_{IN}(N+1)/N$, or $F_{IN}(N-1)/N$, the output of the mixer provides the signal having the frequency $F_{IN}/N$ and can utilize a single filter to eliminate undesired mixer outputs. Further, the frequency synthesizer can be configured to utilize an oscillator which operates over the same frequency range as the reference oscillator.

10 Claims, 5 Drawing Sheets

PROGRAMMABLE FREQUENCY DIVIDER

CROSS-REFERENCE TO RELATED APPLICATION

This is a continuation-in-part of U.S. patent application Ser. No. 08/362,179 now U.S. Pat. No. 5,642,039 entitled "Handheld Vector Network Analyzer", by Bradley et al., filed Dec. 22, 1994, and claims priority therefrom.

BACKGROUND OF THE INVENTION

1. Field of the Invention

The present invention relates to a programmable frequency divider. More particularly, the present invention relates to a programmable frequency divider utilizing components to eliminate undesirable output harmonics while reducing overall required circuitry and power consumption.

2. Description of the Related Art

FIG. 1 illustrates a traditional programmable frequency divider 90 that may be employed in a signal synthesizer for dividing the frequency of a sine wave provided by a signal generator 100. The frequency divider of FIG. 1 receives an input signal from a signal generator 100. Typically, the signal generator 100 provides a set of sine wave signals having frequencies that span the range of an octave. For example, the signal generator 100 may provide sine wave signals ranging from 800 Megahertz ("MHZ") to 1600 MHZ.

In order to provide for a broad range of frequency divisions, the programmable frequency divider 90 includes a plurality of divide by two frequency dividers $110_1$–$110_n$. A first divide by two frequency divider $110_1$ is coupled to the signal generator 100 so that its output provides a square wave signal having one half of the frequency of the signal provided by the signal generator 100. The output of the first frequency divider $110_1$ is coupled to an input of a second divide by two frequency divider $110_2$. The second divide by two frequency divider $110_2$ provides a square wave output signal having one fourth of the frequency of the signal provided by the signal generator 100.

The remainder of the plurality of divide by two frequency dividers are all serially connected together in the same manner as described above. As a result, a nth divide by two frequency divider $110_n$ provides a square wave output signal having a frequency $\frac{1}{2}^n$ times the frequency of the signal generator's output.

The output of each divide by two frequency divider $110_{1-n}$ is coupled to an input of a respective switch $107_{1-n}$. Each switch $107_{1-n}$ is programmed to provide an output from one of the divide by two frequency dividers $110_{1-n}$ to a respective pair of filters $101_{1-n}$ and $102_{1-n}$. The filters $101_{1-n}$, $102_{1-n}$ are low pass filters which remove harmonics present at the output of a respective divide by two frequency divider $110_{1-n}$. Each filter $101_{1-n}$, $102_{1-n}$ has an output coupled to a respective input of an output switch 113. The output switch 113 enables one of the filter $101_{1-n}$ and $102_{1-n}$ outputs to be provided on an output 92 of the programmable frequency divider 90.

Two filters are used for each divide by two frequency divider $110_{1-n}$, to enable filtering of all undesirable odd and even harmonics that occur at the frequency divider's $110_{1-n}$ output over the entire frequency range of the signal generator 100. If the square wave output provided by a divide by two frequency divider $110_{1-n}$ is ideal, the square wave signal has a duty cycle of 50% high time and 50% low time. As a result, the output of the divide by two frequency divider $110_{1-n}$ has no even harmonics.

Unfortunately, the slew rate of each frequency divider $110_{1-n}$ output typically causes the rising edge of the square wave output to be steeper than the falling edge of the square wave output. This causes the square wave's high times to exceed the low times which results in the presence of even harmonics at each frequency divider $110_{1-n}$ output. As the imbalance in the square wave's duty cycle grows, the magnitude of the even harmonics increases.

To illustrate possible signal inputs to the filters $101_{1-n}$ and $102_{1-n}$, FIG. 2A shows the frequency domain output of the first frequency divider $110_1$ ($F_{110}$) in response to an 800 MHZ sine wave input. As shown, the first frequency divider $110_1$ output provides a desired 400 MHZ signal along with the following undesirable harmonics: a second harmonic at 800 MHZ, a third harmonic at 1200 MHZ, and further harmonics at multiples of 400 MHZ. FIG. 2B shows the frequency domain output of the first frequency divider $110_1$ ($F_{110}$) in response to a 1600 MHZ sine wave input. As shown, a desired 800 MHZ signal is provided, along with the following undesirable harmonics: a second harmonic at 1600 MHZ, a third harmonic at 2400 MHZ, and further harmonics at multiples of 800 MHZ. The filters $101_{1-n}$ and $102_{1-n}$ provide for filtering out the undesirable harmonics. As shown in FIGS. 2A and 2B, an 800 MHZ signal is to be filtered out when the sine wave input to the frequency divider $110_1$ is 800 MHZ, and an 800 MHZ signal is to be passed when the sine wave input is 1600 MHZ. Since a single filter cannot both filter out and pass an 800 MHZ signal, filters $101_1$ and $102_1$ are both employed at the output of divide by two frequency divider $101_1$. Filter $101_1$ is employed for filtering out undesirable harmonics for a first half of the possible input signal frequencies being provided to frequency divider $110_1$. Filter $102_1$ is employed for filtering out undesirable harmonics for a second half of the possible input signal frequencies being provided to frequency divider $110_1$. Filters $101_{2-n}$ and $102_{2-n}$ are provided at the outputs of the other frequency dividers $110_{2-n}$ to resolve similar dilemmas. When the signal generator 100 provides signals having frequencies in the range of 800 MHZ–1600 MHZ, filter $101_1$ is selected by switch $107_1$ when the signal generator 100 provides an 800 MHZ–1200 MHZ input signal, and filter $102_1$ is selected by switch $107_1$ when the signal generator 100 provides an input signal above 1200 MHZ.

The use of multiple divide by two frequency dividers $110_{1-n}$ causes the programmable frequency divider 90 of FIG. 1 to occupy a significant amount of circuit board space within a signal synthesizer. The need to employ two low pass filters $101_{1-n}$, $102_{1-n}$ and a switch $107_{1-n}$ with each divide by two frequency divider $110_{1-n}$ further increases the circuit board space required to implement the frequency divider 90 of FIG. 1. Additionally, the use of multiple divide by two frequency dividers $110_{1-n}$ and filter sets $101_{1-n}$, $102_{1-n}$ causes the frequency divider to consume a significant amount of power when operating in the signal synthesizer.

A signal synthesizer may be employed to detect faults in cables and other communications mediums that are part of an installed communications network. By using a portable signal synthesizer, a field engineer may be able to supply many different test signals to an installed medium at a remote location. However, it is desirable for a portable signal synthesizer to be as small as possible, so that it is easy to transport to remote network installations. It is also desirable for a portable synthesizer to consume as little power as possible, so that it can operate for an extended period of time in the field from the power supplied by a battery. Accordingly, it is desirable for a programmable frequency divider being employed in a portable signal synthesizer to have a reduced amount of circuitry and power consumption.

SUMMARY OF THE INVENTION

The present invention provides a broadband frequency divider which consumes less circuit board space and power than traditional frequency dividers. As a result, a frequency divider in accordance with the present invention may be well suited for being used in a portable signal synthesizer.

The present invention is a frequency divider which includes a mixer having a first input coupleable to a reference oscillator and a second input coupleable to the reference oscillator through a frequency synthesizer. The mixer also includes an output for providing a frequency divider output. The frequency synthesizer provides an output signal having a frequency of (N+1)/N or (N−1)/N times the frequency of an input signal provided to the frequency synthesizer. The reference oscillator includes an output for coupling an input signal $F_{IN}$ to the frequency synthesizer. In response to the $F_{IN}$ input signal, the frequency synthesizer provides the signal $F_{IN}(N+1)/N$ or $F_{IN}(N-1)/N$ to the mixer. The output of the mixer combines the signal from the reference oscillator and frequency synthesizer to provide a signal having the frequency $F_{IN}/N$. A single filter coupled to the output of the mixer can be employed to eliminate undesired outputs from the mixer. Further, the frequency synthesizer may be configured to utilize an oscillator which operates over the same frequency range as the reference oscillator.

BRIEF DESCRIPTION OF THE DRAWINGS

Further details of the present invention are explained with the help of the attached drawings in which.

DETAILED DESCRIPTION

Figure 3:
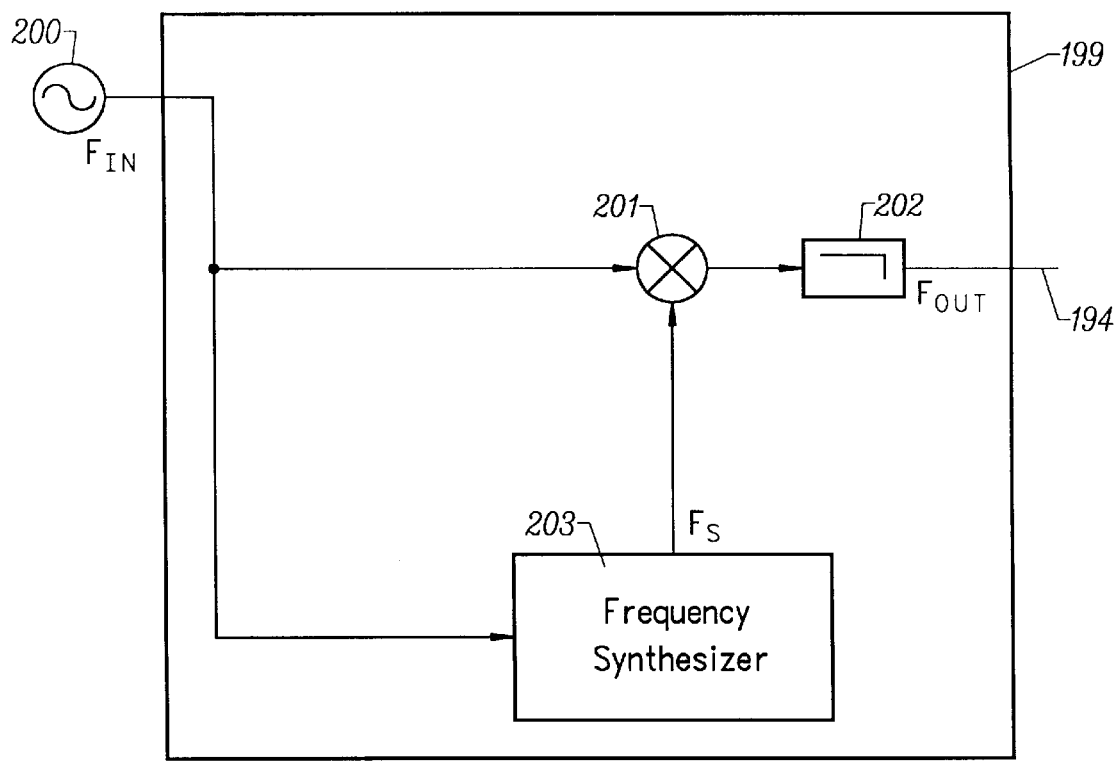
FIG. 3 illustrates a frequency divider in accordance with the present invention.

FIG. 3 illustrates a frequency divider 199 in accordance with the present invention. The frequency divider in FIG. 3 has an input 198 to receive signals from a signal generator 200, such as a reference oscillator, which provides sine waves having varying frequencies. The output of signal generator 200 is coupled to a first input of a mixer 201. The output of signal generator 200 is also coupled to an input of a frequency synthesizer 203. The output of the frequency synthesizer 203 then provides a second input to mixer 201. An output of the mixer 201 is coupled to an input of a low pass filter 202. The output of the filter 202 forms the output 194 of the frequency divider 199.

In operation, the signal generator 200 provides a sine wave signal having a frequency of $F_{IN}$ to the frequency synthesizer 203 and mixer 201. The signal generator 200 is able to provide sine wave signals over a range of frequencies. In one embodiment of the present invention, the range of frequencies provided by the signal generator 200 spans an octave. For example, the frequencies provided may range between 800 MHZ to 1600 MHZ.

The frequency synthesizer 203 processes the signal to provide a signal to the mixer 201 having a frequency of $F_S$ selectably set to $F_{IN}(N+1)/N$ or $F_{IN}(N-1)/N$. The mixer 201 combines the signal from signal generator 200 with the signal from the frequency synthesizer 203. As a result of combining the input signals, the output of mixer 201 provides both a sine wave signal having a frequency resulting from the addition of $F_{IN}$ and $F_S$, $(F_{IN}+F_S)$, and a sine wave signal having a frequency resulting from the absolute value of the subtraction of $F_{IN}$ and $F_S$, $(|F_{IN}-F_S|)$. The output of the mixer 201 also includes leakage signals from each of the mixer's inputs. The leakage signal from the input coupled directly to the signal generator 200 has a frequency of $F_{IN}$, and the leakage signal from the input coupled to the frequency synthesizer 203 has a frequency of $F_S$.

The low pass filter 202 passes the signal resulting from the mixer's absolute value subtraction of $F_{IN}$ and $F_S$. The low pass filter 202 also filters out the signal resulting from the mixer's addition of $F_{IN}$ and $F_S$, as well as the mixer's leakage signals. As a result, the low pass filter's 202 output only provides the desirable mixer output, which has a frequency of the absolute value of $F_{IN}-F_S$.

When $F_S$ is set to equal $F_{IN}(N+1)/N$, the mixer 201 provides a desired mixer output having a frequency $F_{OUT}$, according to the following calculation:

$$\begin{align} F_{OUT} &= F_S - F_{IN} & (1)\\ &= F_{IN}(N+1)/N - F_{IN} & (2)\\ &= F_{IN}(((N+1)/N)-1) & (3)\\ &= F_{IN}((N+1-N)/N) & (4)\\ &= F_{IN}/N & (5) \end{align}$$

When $F_S$ is set to equal $F_S(N-1)/N$ the mixer 201 provides a desired signal having a frequency $F_{OUT}$, according to the following calculation:

$$\begin{align} F_{OUT} &= F_{IN} - F_S & (6)\\ &= F_{IN} - F_{IN}(N-1)/N & (7)\\ &= F_{IN}((1-((N-1)/N)) & (8)\\ &= F_{IN}((N-N+1)/N) & (9)\\ &= F_{IN}/N & (10) \end{align}$$

In operation, the user of the frequency divider 199 provides a value for N to the frequency synthesizer 203. In one embodiment of the present invention, the value provided for N may be any integer in the range of 4 to 2048. This provides for the use of only a single low pass filter 202, when the frequency range of the signal generator 200 is one octave. The single filter 202 is able to filter out the mixer's undesirable leakage outputs and output having a frequency of $F_{IN}+F_S$, while passing the desired mixer output with a frequency of $F_{OUT}$. This is possible, because the combination of a minimum N value of 4 and the frequency range of the signal generator 200 being an octave ensures that the desired $F_{OUT}$ mixer output frequency never overlaps with the frequency of the undesirable mixer leakage outputs and mixer $F_{IN}+F_S$ frequency output.

Although the invention has been described with respect to the minimum value for N being 4 and the signal generator's frequency range being an octave, the present invention is not limited to only these circumstances. The present invention may be employed using a single low pass filter 202 in any case in which the frequencies that the low pass filter 202 is required to pass do not overlap with the frequencies that the low pass filter 202 is required to filter out.

Figure 1:
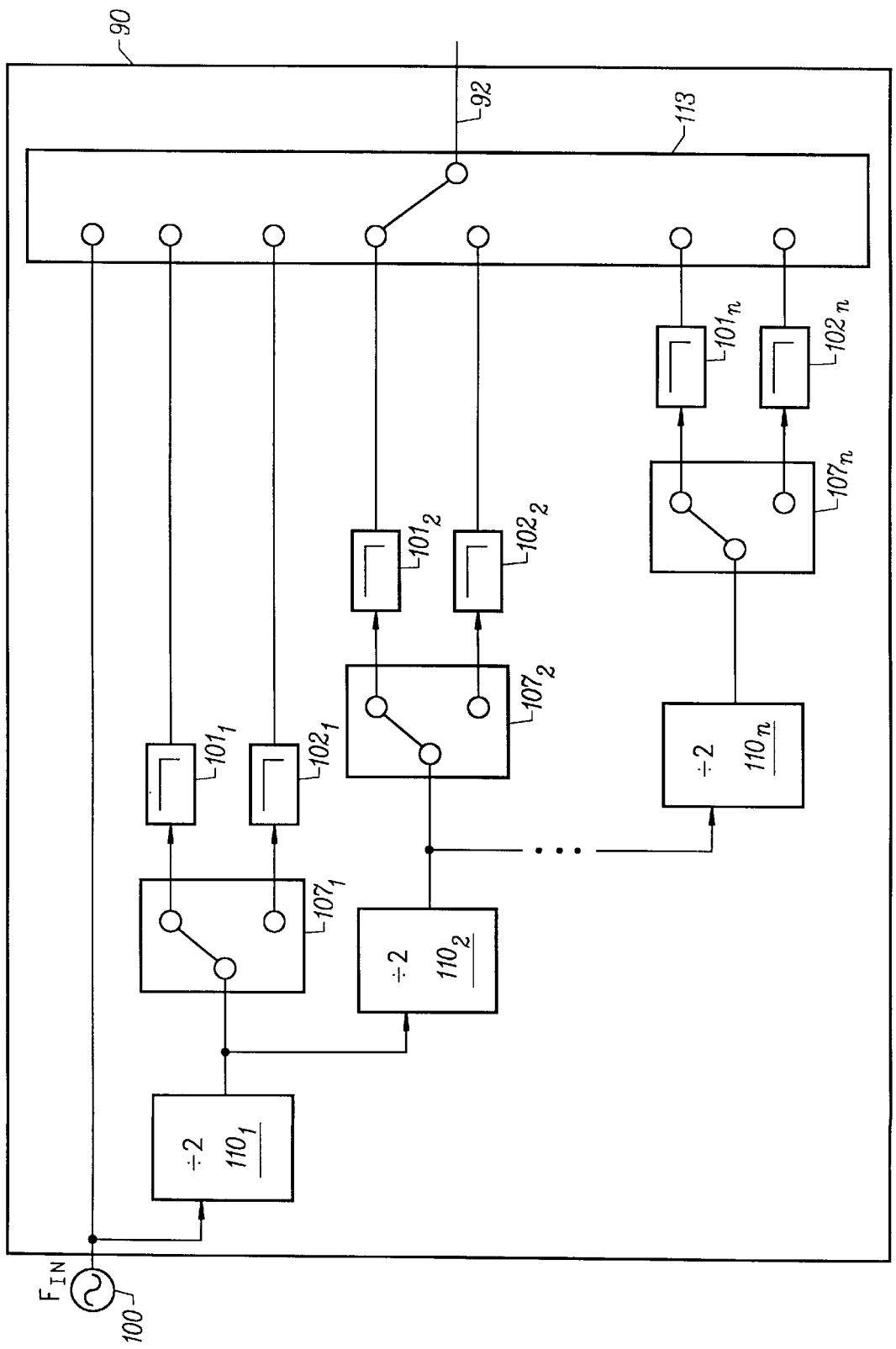
FIG. 1 illustrates a traditional frequency divider.
Figure 2A:
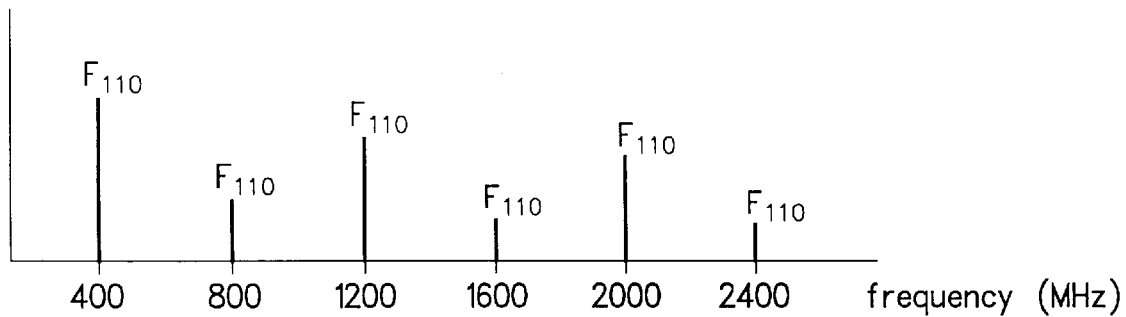
FIG. 2A illustrates the frequency domain output of a divide by two frequency divider shown in FIG. 1 in response to an 800 MHZ sine wave input.
Figure 2B:
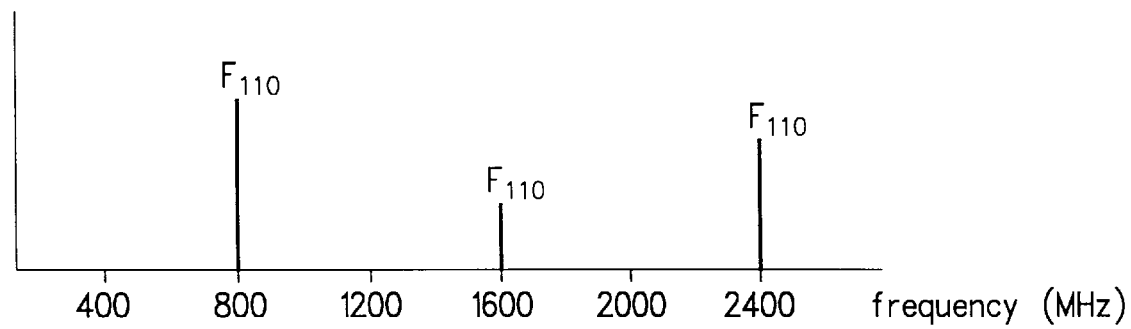
FIG. 2B illustrates the frequency domain output of a divide by two frequency divider shown in FIG. 1 in response to a 1600 MHZ sine wave input.

The combination of the mixer 201 and frequency synthesizer 203 in the frequency divider 199 shown in FIG. 3 replaces the serially connected group of divide by two frequency dividers $101_{1-n}$ shown in FIG. 1. This allows the frequency divider 199 in FIG. 3 to be manufactured with reduced circuitry that requires less circuit board space to implement. In addition to the elimination of multiple divide by two circuits $110_{1-n}$, the combination of the mixer 201 and frequency synthesizer 203 provides for the use of only one filter 202, instead of multiple sets of filters $101_{1-n}$, $102_{1-n}$ and switches $107_{1-n}$. Additionally, the reduced circuitry required for the frequency divider 199 in FIG. 3 results in less power being consumed by frequency divider 199 than is consumed by frequency divider 90 in FIG. 1.

An additional benefit of the frequency divider 199 shown in FIG. 3 is that its jitter performance is not degraded from the jitter performance of the traditional frequency divider 90 shown in FIG. 1. In the frequency divider shown in FIG. 1, the jitter on the signal provided at the frequency divider output 92 has a magnitude equal to the jitter on the signal generator 100 output. However, the jitter is reduced as a percent of the output signal's period. The ratio of the magnitude of the jitter on the output 92 to the period of the signal provided on the output 92 is ($\frac{1}{2^n}$) times the ratio of the magnitude of the jitter on the signal generator 100 output to the period of the signal provided at the signal generator 100 output. The variable "n" is the number of the divide by two frequency divider $110_{1-n}$ that is driving the output 92.

In a frequency divider 199 in accordance with the present invention, the magnitude of the jitter on the signal provided at the output 194 of the frequency divider 199 is also equal to the magnitude of the jitter on the signal provided by the signal generator 200. Further, the ratio of the jitter's magnitude to the period of the signal provided at the output 194 is (1/N) times the ratio of the jitter's magnitude to the period of the signal provided by the signal generator 200. The variable "N" is the above-described value that is provided to the frequency synthesizer. The values "N" and ($2^n$) indicate the value by which each frequency divider's, 199 and 90 respectively, input signal is divided.

Figure 4:
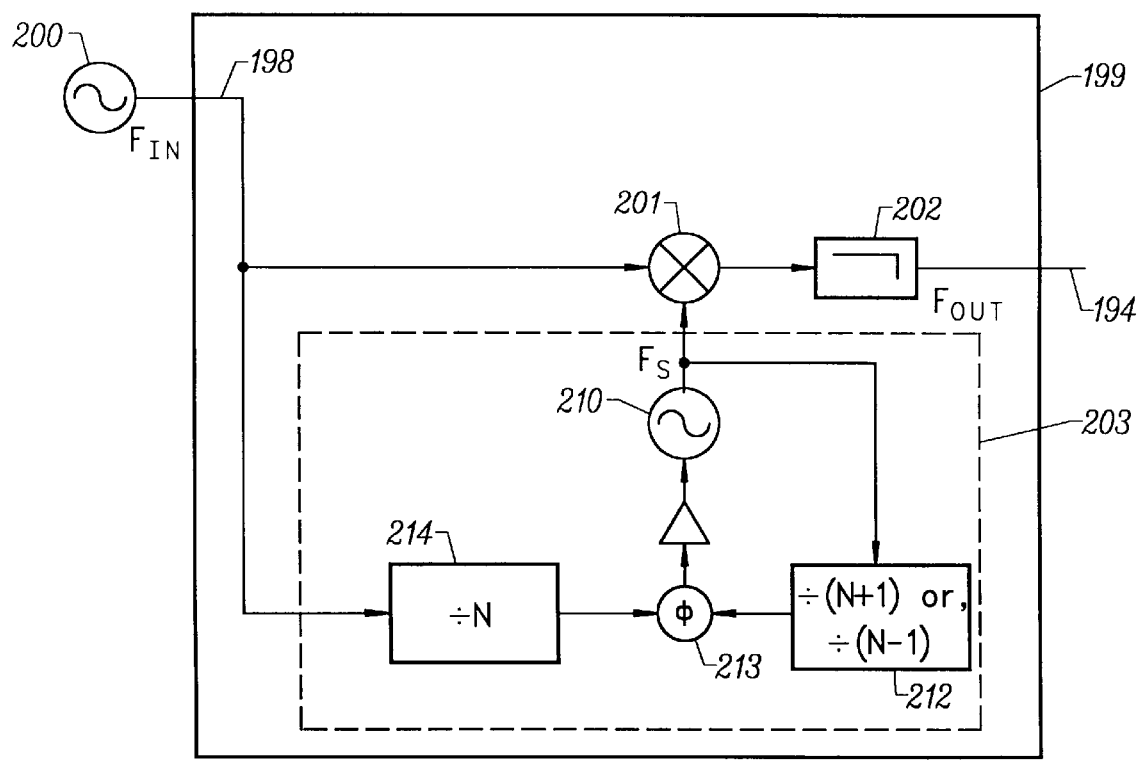
FIG. 4 illustrates an embodiment of the frequency synthesizer shown in FIG. 3.

FIG. 4 illustrates an embodiment of the frequency synthesizer 203 shown in FIG. 3. In FIG. 4, the input of the frequency synthesizer 203 is formed by an input to a divide by N frequency divider 214 that is included in the frequency synthesizer 203. An output of the divide by N frequency divider 214 is coupled to a first input of a phase detector 213. An output of the phase detector 213 is coupled to the voltage control input of a voltage controlled oscillator (VCO) 210. An output of the VCO 210 forms the output of the frequency synthesizer 203 for coupling to the mixer 201. The output of the VCO 210 is further coupled to an input of another frequency divider 212 that is included within the frequency synthesizer 203. The frequency divider 212 selectively provides an output signal having a frequency equal to N+1 times an input signal's frequency, or N−1 times the input signal's frequency. An output of the frequency divider 212 is coupled to a second input of the phase detector 213.

In operation, the phase detector 213 controls the frequency of the VCO 210 to cause the signal inputs to the phase detector 213 to have the same frequency and phase. As a result, with frequency divider 212 controlled to provide an output frequency N+1 times its input frequency, the following relationship is established:

$$F_{IN}/N = F_S/(N+1) \tag{11}$$

$$F_S = F_{IN}((N+1)/N) \tag{12}$$

With frequency divider 212 controlled to provide an output frequency N−1 times its input frequency, the following relationship is established:

$$F_{IN}/N = F_S/(N-1) \tag{13}$$

$$F_S = F_{IN}((N-1)/N) \tag{14}$$

A user may program the frequency synthesizer 203 with a desired value for N and set whether the frequency divider provides the relation N+1 or N−1. As a result, the signal $F_{OUT}$ from the output of the filter 202 can be expressed using equations 1–5 or 6–10 above.

By controlling frequency divider 212 to provide an output having a frequency division value of N+1 or N−1, oscillators operating over the same frequency range may be used for the signal generator 200 and the VCO 210. This enables a greater range of output frequencies $F_{OUT}$ to be provided than if a single division value of N+1 or N−1 were used with the signal generator (for example a VCO) 200 and VCO 210 operating over the same frequency range. For example, with the signal generator 200 having a frequency ranging from 600–1200 MHZ and the VCO 210 providing a maximum frequency of 1200 MHZ, selected values for N, a selection of N+1 or N−1 in the frequency divider 212 for a range of $F_S$ values, and the corresponding ranges of $F_{IN}$ and $F_{OUT}$ are shown in Table A below.

TABLE A

| N | (N ± 1) | $F_{IN}$ (MHZ) | $F_S$ (MHZ) | $F_{OUT}$ (MHZ) |
|---|---|---|---|---|
| 4 | 3 | 960–1200 | 720–900 | 240–300 |
| 4 | 5 | 600–960 | 750–1200 | 150–240 |
| 8 | 7 | 1066–1200 | 933–1050 | 133–150 |
| 8 | 9 | 600–1066 | 675–1200 | 75–133 |

Figure 5:
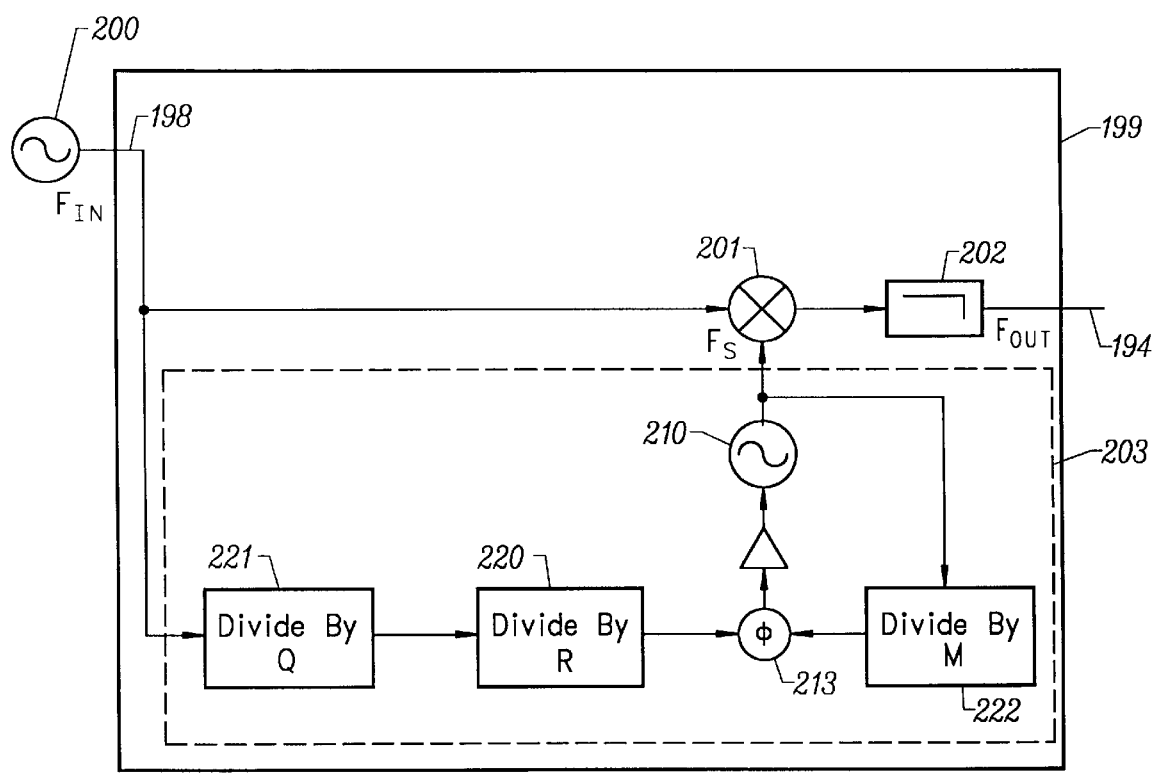
FIG. 5 illustrates an alternate embodiment of the frequency synthesizer shown in FIG. 3.

FIG. 5 illustrates an alternate embodiment of the frequency synthesizer 203 shown in FIG. 3. In FIG. 5, the frequency synthesizer 203 includes a divide by Q frequency divider 221. The divide by Q frequency divider 221 has an input forming the input of the frequency synthesizer 203 for receiving the signal $F_{IN}$. The output of the divide by Q frequency divider 221 is coupled to an input of a divide by R frequency divider 220. The output of the divide by R frequency divider 220 is coupled to a first input of a phase detector 213. An output of the phase detector 213 is coupled to a voltage control input of a VCO 210. An output of the VCO 210 provides the output of the frequency synthesizer 203 to the mixer 201. The output of the VCO 210 is also coupled to an input of a divide by M frequency divider 222. The output of the divide by M frequency divider 222 is coupled to a second input of the phase detector 213.

The configuration of the circuit of FIG. 5 enables holding the value for M in frequency divider 222 more constant with variations in $F_S$ as compared with the frequency division value in the frequency divider 212 shown in FIG. 4. Further, a single off the shelf chip can be used to provide the components 220 and 222. The prescaler divide by Q frequency divider 221 can then be provided on an additional chip.

In operation, the phase detector 213 controls the VCO 210 as described above to cause the frequencies and phases at the two inputs of the phase detector 213 to be equal. Accordingly, the following relationship exists:

$$F_{IN}/(Q*R) = F_S/M \qquad (15)$$

$$F_S = F_{IN}(M/(Q*R)) \qquad (16)$$

As described above, the desired frequency synthesizer output $F_S$ may be set to equal either $F_{IN}(N+1)/N$ or $F_{IN}(N-1)/N$. Accordingly, the following relationships exist:

$$M/(Q*R) = (N+1)/N \qquad (17)$$

$$M/(Q*R) = (N-1)/N \qquad (18)$$

The relationship in equation 17 is employed when $F_S$ is set to equal $F_{IN}(N+1)/N$, and the relationship in equation 18 is employed when $F_S$ is set to equal $F_{IN}(N-1)/N$.

A user may select values for Q, R, and M so that equations 17 and 18 are satisfied for the user's desired value of N. The value for M may be altered depending on the selected value for $F_S$. As with the circuit shown in FIG. 4, values of Q, R and M may be selected so that oscillators operating over the same frequency range may be used for the signal generator 200 as well as the VCO 210.

In one embodiment of the present invention, the divide by R frequency divider 220 and divide by M frequency divider 222 are integrated onto a single integrated circuit. One such integrated circuit is the LMX2320 PLLatinum™ Frequency Synthesizer for RF Personal Communications, which is sold by National Semiconductor Corporation. The February 1996 data sheet for the LMX2320, entitled LMX2320/LMX2325 PLLatinum™ Frequency Synthesizer for RF Personal Communications, LMX2325 2.5 GHz, LMX2320 2.0 GHz, is hereby incorporated by reference.

Although the invention has been described above with particularity, this was merely to teach one of ordinary skill in the art to make and use the invention. Many modifications will fall within the scope of the invention, as that scope is defined by the following claims.

What is claimed is:

1. A frequency divider having an input receiving an input signal and an output, said frequency divider comprising:
   a mixer having a first input coupled to the frequency divider input, a second input, and an output coupled to the output of said frequency divider; and
   a frequency synthesizer having an input coupled to the frequency divider in put and an output coupled to said second input of said mixer, wherein said frequency synthesizer comprises:
   a first frequency divider having an input forming said input of said frequency synthesizer and an output;
   a second frequency divider having an input and an output;
   a phase detector having a first input coupled to said output of said first frequency divider, a second input coupled to said output of said second frequency divider, and an output; and
   a first voltage controlled oscillator (VCO) having an input coupled to said output of said phase detector and an output coupled to said second input of said mixer and said input of said second frequency divider.

2. The frequency divider of claim 1, wherein the first frequency divider divides its input by a number N and the second frequency divider divides its input by the number N+1.

3. The frequency divider of claim 1, wherein the first frequency divider divides its input by a number N and the second frequency divider divides its input by the number N−1.

4. The frequency divider of claim 1, wherein a second VCO has an input coupled to the input of the frequency divider to provide the input signal, and the first VCO and the second VCO operate over substantially the same frequency range.

5. The frequency divider of claim 1, further including a low pass filter coupling an output of the mixer to the output of the frequency divider, the low pass filter having a pass band no greater than ½ times the maximum frequency of the input signal.

6. A frequency divider having an input receiving an input signal and an output, said frequency divider comprising:
   a mixer having a first input coupled to the frequency divider input, a second input, and an output coupled to the output of said frequency divider; and
   a frequency synthesizer having an input coupled to the frequency divider input and an output coupled to said second input of said mixer, wherein said frequency synthesizer comprises:
   a first frequency divider having an input forming said input of said frequency synthesizer and an output;
   a second frequency divider having an input coupled to said output of said first frequency divider and an output;
   a third frequency divider having an input and an output;
   a phase detector having a first input coupled to said output of said second frequency divider, a second input coupled to said output of said third frequency divider, and an output;
   a voltage controlled oscillator having an input coupled to said out put of said phase detector and an output coupled to said second input of said mixer and said input of said third frequency divider.

7. The frequency divider of claim 6, wherein said synthesizer provides a signal at its output equal to (N+1)/N times a frequency of a signal provided at its input, where N is an integer.

8. The frequency divider of claim 6, wherein said synthesizer provides a signal at its output equal to (N−1)/N times a frequency of a signal provided at its input, where N is an integer.

9. The frequency divider of claim 1, wherein the first frequency divider divides its input by a number N and the second frequency divider divides its input by one of N+1, and N−1, where N is an integer.

10. The frequency divider of claim 6, wherein said synthesizer selectively provides one of a number of signals at its output with a frequency equal to one of (N+1)/N and (N−1)/N times a frequency of a signal provided at its input, where N is an integer.

* * * * *